(12) United States Patent
Rajagopalan (10) Patent No.: US 6,339,349 B1
(45) Date of Patent: Jan. 15, 2002

(54) METHOD AND CIRCUIT FOR COMPARATOR-LESS GENERATION OF RAMPED VOLTAGE HAVING CONTROLLED MAXIMUM AMPLITUDE

(75) Inventor: Jayendar Rajagopalan, Santa Clara, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/496,572

(22) Filed: Feb. 2, 2000

(51) Int. Cl.[7] .................................................. H03K 4/06
(52) U.S. Cl. ........................ 327/131; 327/138; 327/140; 327/341
(58) Field of Search ................................. 327/131, 132, 327/135, 137, 138, 336, 337, 339, 341, 344, 345, 140; 331/57

(56) References Cited

U.S. PATENT DOCUMENTS

| | | | | |
|---|---|---|---|---|
| 3,828,203 A | * | 8/1974 | Belson et al. ................ | 327/132 |
| 4,009,399 A | * | 2/1977 | Hofer .......................... | 327/132 |
| 4,016,498 A | * | 4/1977 | Hadley ........................ | 327/132 |
| 5,180,995 A | * | 1/1993 | Hayashi et al. .............. | 331/57 |
| 5,642,066 A | * | 6/1997 | Burke .......................... | 327/132 |
| 5,898,343 A | * | 4/1999 | Morgan ....................... | 331/57 |
| 5,926,042 A | * | 7/1999 | Talaga, Jr. ................... | 327/132 |

* cited by examiner

Primary Examiner—Timothy P. Callahan
Assistant Examiner—An T. Luu
(74) Attorney, Agent, or Firm—Girard & Equitz LLP (57) ABSTRACT

A circuit for generating a ramped voltage having controlled maximum amplitude (e.g., for use in a switching controller), and a method for generating such a ramped voltage without use of a comparator. The ramped voltage is a voltage developed across a periodically charged and discharged capacitor, or optionally a level-shifted version of such voltage. Preferably, a ring oscillator generates a clock signal (without use of a comparator) for use in controlling the periodic charging and discharging of the capacitor, and a feedback loop generates a supplemental charging current for the capacitor in response to feedback indicative of the ramped output voltage. Preferably, the ring oscillator is a current-starved ring oscillator biased by a zero temperature coefficient bias current source, and the feedback loop includes a sample-adjust-hold circuit which samples the ramped output voltage shortly before the capacitor discharges, generates an adjustment voltage indicative of the difference between a reference voltage and the sampled output voltage, and holds the adjustment voltage for use in the next charging cycle. Preferably, a current mirror generates the supplemental charging current in response to the adjustment voltage held by the sample-adjust-hold circuit. The ramped voltage generation circuit can be implemented in less area (for the same ramped voltage frequency) than required for a conventional circuit employing at least one comparator, with the ramped voltage peak and valley levels being invariant to process and temperature variations, and with reduced supply voltage.

20 Claims, 7 Drawing Sheets

| FIG. 4A | FIG. 4B |

METHOD AND CIRCUIT FOR COMPARATOR-LESS GENERATION OF RAMPED VOLTAGE HAVING CONTROLLED MAXIMUM AMPLITUDE

BACKGROUND OF THE INVENTION

1. Field of the Invention

The present invention relates to methods and circuitry for generating ramped voltage signals having controlled maximum amplitude, without use of a comparator. In preferred embodiments, the invention is a switching controller which generates at least one ramped voltage signal (for use in generating at least one pulse width modulated power switch control signal for a DC-to-DC converter) such that each ramped voltage signal has a controlled maximum amplitude.

2. Description of the Related Art

In power supply circuitry, it is often desired to produce a ramped voltage or multiple, parallel channels of ramped voltages. For example, in some DC-to-DC converters (sometimes referred to as interleaved PWM DC-to-DC converters, where "PWM" denotes "pulse width modulated"), multiple channels of ramped voltages are provided to comparator circuitry for use in generating power switch control signals for controlling the duty cycle of each power switch of the DC-DC converter and thus the amplitude of the DC output voltage. The waveforms and maximum amplitudes of the ramped voltages are identical (to the extent practical) except that each has a different phase than the others.

More generally, circuitry providing ramped voltage signals with controlled maximum amplitude is useful for a wide variety of applications, including but not limited to interleaved PWM DC-to-DC converter applications. However, when implementing such circuitry (especially when implementing it as an integrated circuit or part of an integrated circuit), process and temperature variations typically cause variations in the characteristics (e.g., maximum amplitude) of the ramped voltages.

Figure 1:
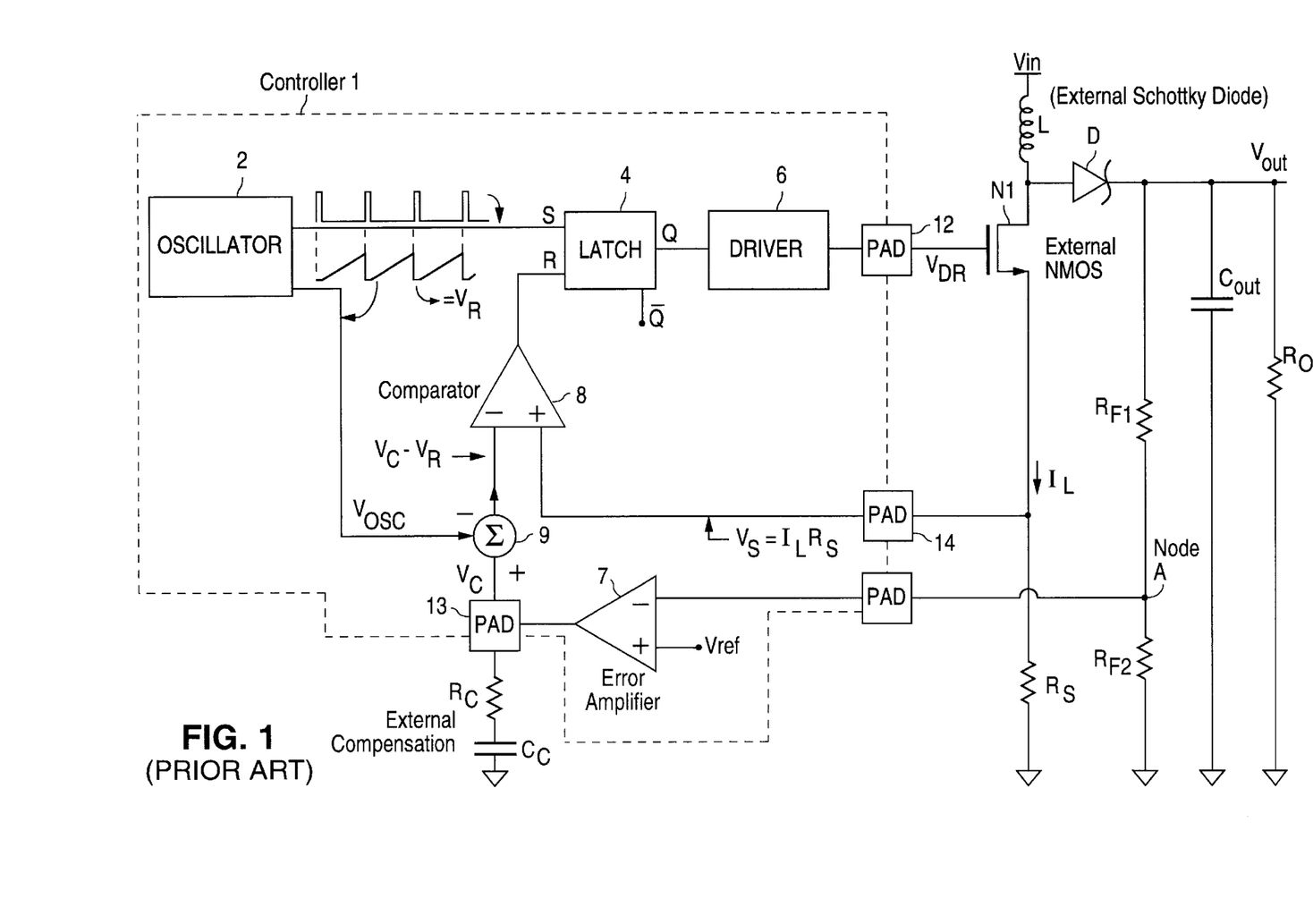
FIG. 1 is a schematic diagram of a conventional DC-to-DC converter which uses a ramped voltage (voltage $V_R$) to generate a pulse width modulated power switch control signal for a power switch (transistor N1).

FIG. 1 is a conventional DC-to-DC converter which includes current mode switching controller 1 implemented as an integrated circuit, and boost converter circuitry which is external to controller chip 1. The boost converter circuitry comprises NMOS transistor N1 (which functions as a power switch), inductor L, current sense resistor $R_s$, Schottky diode D, capacitor $C_{out}$, feedback resistor divider $R_{F1}$, and $R_{F2}$, compensation resistor $R_c$, and compensation capacitor $C_c$, connected as shown. The FIG. 1 circuit produces a regulated DC output voltage $V_{out}$ across load $R_o$, in response to input DC voltage $V_{in}$.

Controller chip 1 includes oscillator 2 (having a first output and a second output), comparator 8, driver 6 which produces an output potential $V_{DR}$ at pad 12 (to which the gate of switch N1 is coupled), latch 4 (having "set" terminal coupled to oscillator 2, "reset" terminal coupled to the output of comparator 8, and an output coupled to the input of driver 6), error amplifier 7 (having a non-inverting input maintained at reference potential $V_{ref}$), and circuit 9 (having a first input coupled to the second output of oscillator 2, a second input coupled to pad 13, and an output coupled to the inverting input of comparator 8).

Pad 13 is at potential $V_c$, which is determined by the output of error amplifier 7 (in turn determined by the difference between the instantaneous potential at Node A and the reference potential $V_{ref}$) and the values of external resistor $R_c$ and capacitor $C_c$. Reference potential $V_{ref}$ is set (in a well known manner) by circuitry within chip 1, and is normally not varied during use of the circuit. In order to set (or vary) the regulated level of the output voltage $V_{out}$, resistors $R_{F1}$, and $R_{F2}$ with the appropriate resistance ratio $R_{F1}/R_{F2}$ are employed.

Oscillator 2 asserts a clock pulse train (having fixed frequency and waveform as indicated) at its first output, and each positivegoing leading edge of this pulse train sets latch 4. Each time latch 4 is set, the potential $V_{DR}$ asserted by driver 6 to the gate of transistor N1 causes transistor N1 to turn on, which in turn causes current $I_L$ from the source of N1 to increase in ramped fashion (more specifically, the current $I_L$ increases as a ramp when transistor N1 is on, and is zero when transistor N1 is off. The current through diode D is zero when N1 is on, it increases sharply when N1 switches from on to off, then falls as a ramp while N1 is off, and then decreases sharply to zero when N1 switches from off to on). Although transistor N1 turns on at times in phase with the periodic clock pulse train, it turns off at times (which depend on the relation between reference potential $R_{ref}$ and the instantaneous potential at Node A) that have arbitrary phase relative to the pulses of the periodic clock pulse train.

Oscillator 2 asserts ramped voltage $V_R$ (which periodically increases at a fixed ramp rate and then decreases, with a waveform as indicated) at its second output. Circuit 9 asserts the potential $V_c-V_R$ to the inverting input of comparator 8. Assertion of the potential $V_c-V_R$ (rather than $V_c$) to comparator 8 is necessary for stability.

The non-inverting input of comparator 8 is at potential $V_s=I_L R_s$, which increases in ramped fashion in response to each "set" of latch 4 by oscillator 2. When $V_s=V_c-V_R$ (after latch 4 has been set), the output of comparator 8 resets latch 4, which in turn causes the potential $V_{DR}$ asserted by driver 6 to the gate of transistor N1 to turn off transistor N1. Thus, by the described use of both of the signals output from oscillator 2 and feedback asserted to error amplifier 7 from Node A, controller chip 1 switches transistor N1 on and off with timing that regulates the output potential $V_{out}$ of the FIG. 1 circuit.

Figure 2:
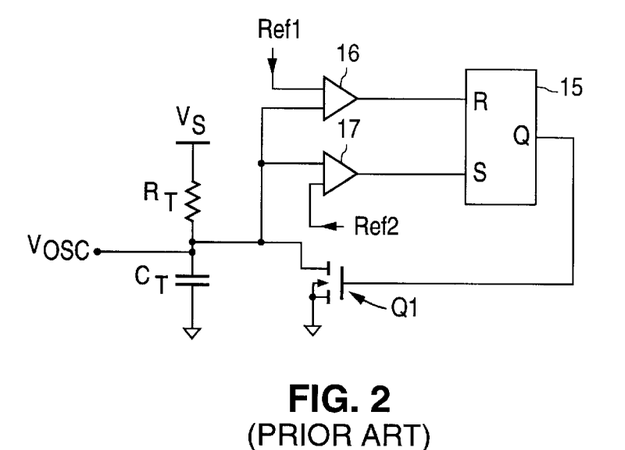
FIG. 2 is a schematic diagram of a conventional circuit for generating ramped voltage $V_R$.

FIG. 2 is a diagram of a conventional circuit for generating a ramped voltage $V_R$ of the type mentioned with reference to FIG. 1. In the FIG. 2 circuit, which is typically implemented as part of a controller chip, the voltage across capacitor $C_T$ is the ramped voltage $V_R$. The voltage across capacitor $C_T$ increases while switch Q1 (implemented as a transistor) is open (i.e., when no current flows through the channel of Q1), as current flows from the top rail through resistor $R_T$ to the top plate of the capacitor, and decreases rapidly when switch Q1 is closed to cause capacitor $C_T$ to discharge. Comparator 16 compares the output potential $V_R$ with a first reference potential Ref1, and asserts a "reset" signal to latch 15 when the output potential rises to the first reference potential Ref1. In response to the reset signal, latch 15 asserts a control signal which causes switch Q1 to enter its closed state. A second comparator 17 compares the output potential $V_R$ with a second reference potential Ref2 (which is lower than reference potential Ref1), and asserts a "set" signal to latch 15 when the output potential falls to the second reference potential Ref2. In response to the set signal, latch 15 asserts a control signal which causes switch Q1 to enter its open state.

However, the conventional circuit of FIG. 2 has a number of disadvantages and limitations, including the following:

large (in terms of area on the controller chip) and complex circuitry is required to implement each of its comparators (comparators 16 and 17). Even larger and more complex circuitry is required to implement a larger number of comparators in DC-to-DC converters having multiple power channels, in which each of multiple channels has a set of one or more comparators for use in generating a ramped voltage;

to generate ramped voltage $V_R$ with a very high frequency (very short period), it may be necessary to implement each comparator to have low propagation delay (e.g., in the range from 10 nsec to 15 nsec), which necessitates high performance, high quiescent current comparator designs; and due to use of the comparators (comparators 16 and 17), the ramped voltage $V_R$ has a frequency dependent offset. It is difficult to compensate for the nonlinear variation (with frequency) of the characteristics of ramped voltage $V_R$, and it may be impractical to implement the controller to be capable generating ramped voltage $V_R$ with a very high frequency.

The ramped generation circuit of the invention is useful to replace the circuitry within oscillator circuit 2 of FIG. 1 for generating ramped voltage $V_R$ (which circuitry can have the design of FIG. 2).

U.S. patent application Ser. No. 09/231,046, filed Jan. 14, 1999 and assigned to the assignee of the present invention, discloses ramped voltage generation circuitry for use in a current mode switching controller for a DC-to-DC converter having multiple channels. The ramped voltage generation circuitry generates multiple ramped voltages, each having a different phase. The maximum amplitude of each ramped voltage is controlled in the following manner to be uniform. In response to a clock signal (one clock signal per channel), ramped voltage generating capacitors (one for each channel) are periodically charged and discharged. In the disclosed embodiment, each clock signal is generated using logic circuitry, a clock generation capacitor, and a comparator. In each channel, a feedback loop (comprising an amplifier, capacitor, transistor, and current mirror) controls the rate at which the ramped voltage generating capacitor charges, using feedback (which is provided to the feedback loop during a short interval of time immediately before the ramped voltage generating capacitor discharges) indicative of the voltage across the ramped voltage generating capacitor. Although each ramped voltage generating capacitor charges periodically and discharges periodically, the feedback tends to move the level of each ramped voltage signal toward a desired maximum amplitude (during the short interval of time just before the ramped voltage generating capacitor discharges). However, use of clock signal generation circuitry including a comparator in this ramped voltage generation circuit has disadvantages and limitations including those mentioned above (the clock signal generating circuitry is large in terms of area on the controller chip, complex circuitry is required to implement the comparator with high performance, high quiescent current characteristics (where the clock must have very high frequency), and use of a comparator in the clock signal generating circuitry may cause it to be impractical to implement the controller to be capable of generating ramped voltages having very high frequency).

U.S. patent application Ser. No. 09/365,968, filed Aug. 2, 1999 (assigned to the assignee of the present invention), also discloses a ramped voltage generation circuit for use in a current mode switching controller for a DC-to-DC converter. The ramped voltage generation circuit employs a clock signal to periodically charge and discharge a ramped voltage generating capacitor, and a feedback loop (comprising an amplifier, capacitor, transistor, and current mirror) to control the rate at which the ramped voltage generating capacitor charges. U.S. application Ser. No. 09/365,968 does not disclose circuitry for generating the clock signal.

SUMMARY OF THE INVENTION

In a class of embodiments, the invention is a circuit for generating at least one ramped voltage for use in a switching controller for a DC-to-DC converter, and a method for generating such a ramped voltage without use of any comparator. The ramped voltage generation circuit generates a ramped voltage signal having controlled maximum amplitude without use of a comparator. The ramped voltage is a voltage developed across a periodically charged (and discharged) capacitor, or optionally a level-shifted version of such a voltage. In a class of preferred embodiments, the inventive circuit includes a ring oscillator which generates a clock signal (without use of a comparator) for use in controlling the periodic charging and discharging of the capacitor, and a feedback loop which generates a supplemental charging current for the capacitor (in response to feedback indicative of the ramped output voltage). Preferably, the ring oscillator is a current-starved ring oscillator biased at a potential generated using a zero temperature coefficient bias current source, and generates the clock with a frequency that is (or is nearly) temperature invariant. Preferably, the feedback loop includes a sample-adjust-hold circuit which samples the ramped output voltage shortly before the capacitor discharges and generates an adjustment voltage indicative of the difference between a reference voltage and the sampled output voltage (and holds the adjustment voltage for use in the next charging cycle). Thus, feedback is employed to control the ramped output voltage so that its maximum value matches the reference voltage. Preferably, a current mirror generates the supplemental charging current in response to the adjustment voltage held by the sample-adjust-hold circuit.

Elimination of comparators (in accordance with the invention) from a ramped voltage generation circuit overcomes the noted disadvantages and limitations of conventional ramped voltage generation circuits, and saves silicon area (in integrated circuit implementations). In accordance with the invention, a switching controller which generates at least one ramped voltage signal (for use in generating a pulse width modulated power switch control signal for a DC-to-DC converter) can be implemented in a manner consuming less area for the same ramped voltage frequency (than a conventional circuit employing at least one comparator), with the peak and valley levels of the ramped voltage being invariant to process and temperature variations, and with reduced supply voltage ($V_{dd}$).

The invention can be implemented as a portion of a switching controller chip (integrated circuit) which generates one or more ramped voltage signals (each for use in generating a pulse width modulated power switch control signal for a DC-to-DC converter) such that each ramped voltage signal has a controlled maximum amplitude.

BRIEF DESCRIPTION OF THE DRAWINGS

FIG. 4 (comprising FIGS. 4A and 4B) is a schematic diagram of a preferred implementation of a first portion of the ramped voltage generation circuit of FIG. 3.

FIG. 5 (comprising FIGS. 5A and 5B) is a schematic diagram of a preferred implementation of the remaining portion of the ramped voltage generation circuit of FIG. 3.

DETAILED DESCRIPTION OF THE PREFERRED EMBODIMENTS

A preferred embodiment of the inventive circuit will be described with reference to FIGS. 3–5. Switching controller 1' of FIG. 3 includes the elements shown for generating a ramped voltage signal at Node A, and a level-shifted version ($V_R$) of such ramped voltage signal. Controller 1' also includes circuitry (not shown) for generating a pulse width modulated power switch control signal (for a DC-to-DC converter) using the level-shifted version (signal $V_R$ of FIG. 3) of the ramped voltage signal. The power switch control signal generating circuitry of controller 1' can have the design shown in FIG. 1 (with the FIG. 3 embodiment of the inventive ramped voltage generation circuit replacing the circuitry within oscillator circuit 2 of FIG. 1 for generating ramped voltage $V_R$ of FIG. 1).

Figure 3:
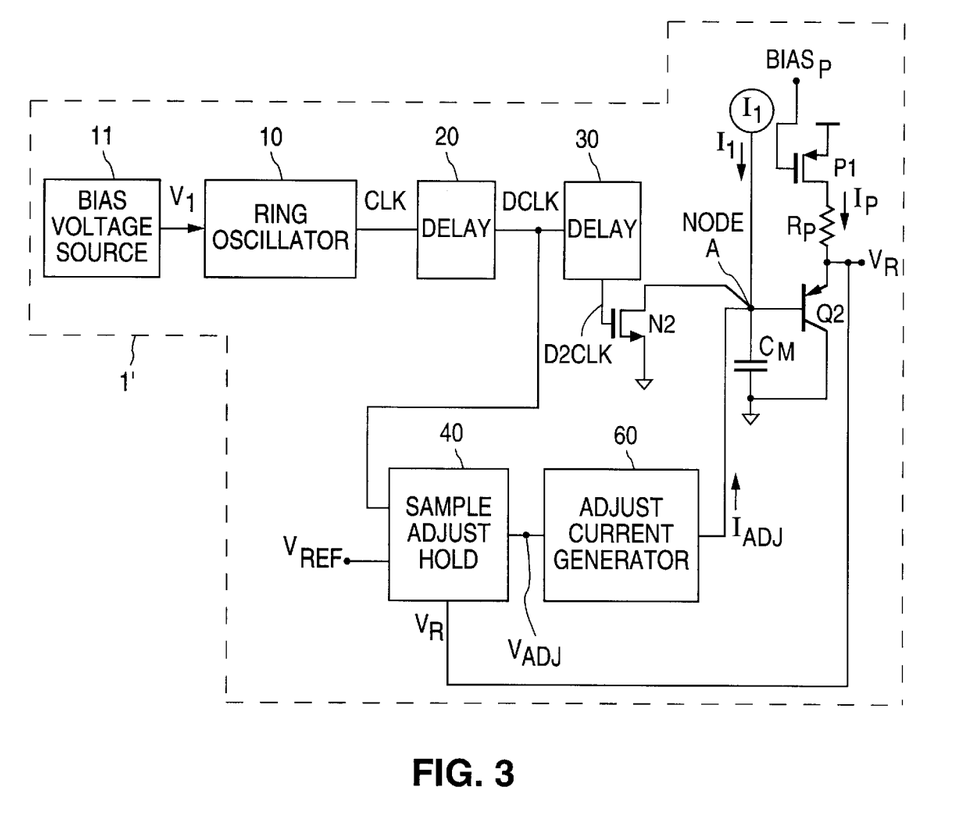
FIG. 3 is a block diagram of an embodiment of the inventive ramped voltage generation circuit, and a controller including such ramped voltage generation circuit.

As shown in FIG. 3, current-starved ring oscillator 10, biased at potential $V_1$ generated by zero temperature coefficient voltage source 11 (including a zero temperature coefficient current source to be described below), generates clock signal CLK. The frequency of clock CLK is preferably at least substantially temperature invariant (varying by no more than 1% with temperature over the operating temperature range) and is typically in the range from 100 kHz to 10 MHz (where the circuit is implemented in accordance with the ABCD150 power BiCMOS process with typical process parameters). Delay circuit 20 produces a delayed voltage pulse train "DCLK" in response to clock signal CLK. Delay circuit 30 produces a twice delayed voltage pulse train "D2CLK" in response to the delayed pulse train "DCLK" asserted at the output of circuit 20. Circuit 30 is preferably identical to circuit 20, and each is implemented by logic gates. In cases in which the frequency of signal CLK is in the range from 100 kHz to 10 MHz, the pulses of the signal DCLK are delayed by 30 nsec relative to those of signal CLK, and the pulses of the twice delayed signal D2CLK are delayed by 60 nsec relative to those of signal CLK.

Each of circuits 11, 10, 20, and 30 is comparator-less (none includes a comparator).

The gate of NMOS transistor N2 is coupled to receive the twice delayed clock signal D2CLK, and the channel of transistor N2 is connected between Node A and ground. Charging current $I_1$, flows from current source 11 to the top plate of ramped voltage generating capacitor $C_M$ (which is Node A). The bottom plate of capacitor $C_M$ is grounded. Charge rate adjusting current $I_{ADJ}$ flows from adjust current generator 60 to Node A. Typically, clock signal D2CLK consists of positive-going pulses each of which is of a duration (e.g., 10 ns or 30 ns) which is short relative to the clock period (typically on the order of 100 or 1000 ns). Thus, clock signal D2CLK periodically turns on transistor N2 for a brief period of time (thus allowing capacitor $C_M$ to discharge through the channel of N2) and then turns off transistor N2 for a longer time (allowing the combined currents $I_1$ and $I_{ADJ}$ to charge capacitor $C_M$). Thus, the voltage between Node A and ground is a ramped voltage having a sawtooth waveform, whose period is the period of clock D2CLK. Level shifting circuitry (comprising bipolar transistor Q2, resistor Rp, and PMOS transistor P1, connected as shown with the gate of P1 biased at potential $BIAS_p$, the source of P1 at top rail potential $V_{dd}$, the base of Q2 at Node A and the collector of Q2 grounded, and resistor Rp connected between the drain of P1 and the emitter of Q2) is provided to shift up (by 0.6 volt) the level of the ramped voltage at Node A.

Figure 6:
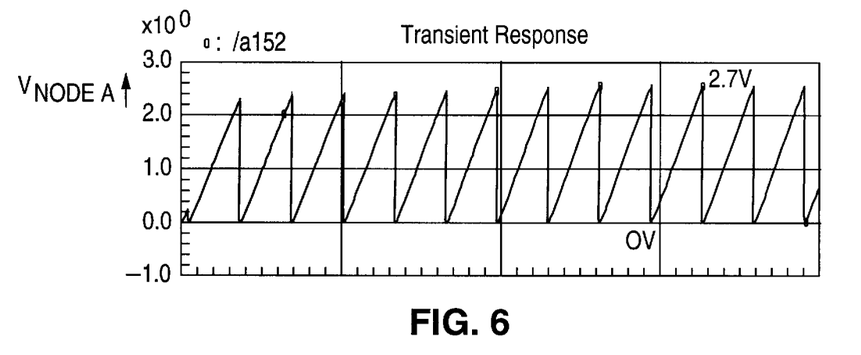
FIG. 6 is a graph showing the waveform of the ramped voltage produced at Node A of a typical implementation of the ramped voltage generation circuit of FIG. 3.
Figure 7:
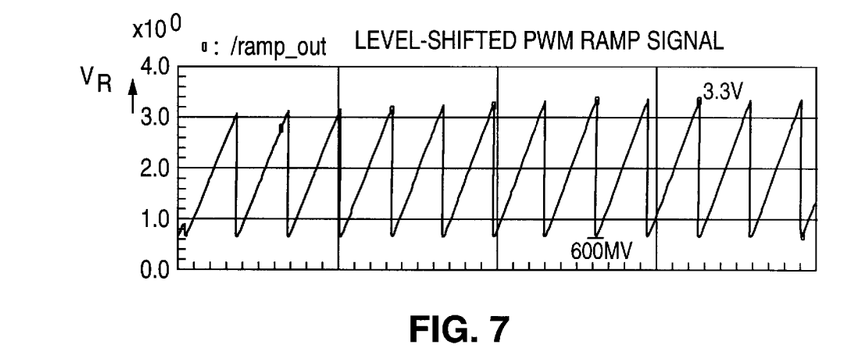
FIG. 7 is a graph showing the waveform of the ramped output voltage $V_R$ produced by a typical implementation of the FIG. 3 circuit.

As shown in FIG. 6, the ramped voltage produced at Node A (of a typical implementation of the FIG. 3 circuit in which the supply potential is 5 volts) has a sawtooth waveform, with peaks at about 2.7 volts and valleys at zero volts (ground potential). As shown in FIG. 7, the level-shifted ramped output voltage $V_R$ produced by the same implementation of the FIG. 3 circuit has a sawtooth waveform with peaks at about 3.3 volts and valleys at 600 mV.

With reference again to FIG. 3, the ramped output voltage $V_R$ produced at the output node is fed back to sample-adjust-hold circuit 40. Circuit 40 samples ramped output voltage $V_R$ shortly before capacitor $C_M$ discharges, generates an adjustment voltage $V_{ADJ}$ which is indicative of the difference between a reference voltage $V_{REF}$ and the sampled output voltage $V_R$, and holds the adjustment voltage for use in the next charging cycle of capacitor $C_M$.

Thus, output capacitor $C_M$ begins to charge at a charge time of each cycle of clock DCLK and begins to discharge at a discharge time of the same cycle of clock DCLK, and circuit 40 generates and holds voltage $V_R$ at a sampling time of the same cycle of clock DCLK, where the charge time precedes the discharge time and the sample time follows the discharge time. Thus, the current $I_{ADJ}$ flowing to Node A from circuit 60 has a constant value from the sampling time of each cycle of clock DCLK (occurring prior to the start of the charging portion of the corresponding cycle of clock D2CLK) through the entire charging portion of such corresponding cycle of clock D2CLK.

Figure 8:
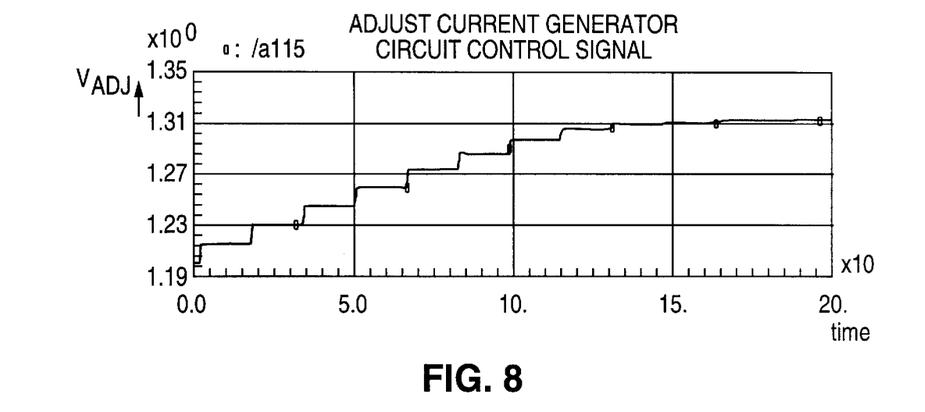
FIG. 8 is a graph showing the output of sample-adjust-hold circuit 40 of a typical implementation of the FIG. 3 circuit.

As shown in FIG. 8, the adjustment voltage $V_{ADJ}$ produced by a typical implementation of sample-adjust-hold circuit 40 typically converges to a steady-state value at which the sampled output voltage $V_R$ matches the reference voltage $V_{REF}$. Thus, FIGS. 6, 7, and 8 indicate that the peak levels (and thus the sampled values) of the output voltage $V_R$ are initially too low, but after several charging cycles of capacitor $C_M$ the peaks of the output voltage $V_R$ rise to the preselected steady-state value (about 3.3 volts), with adjustment voltage $V_{ADJ}$ rising (from cycle to cycle) to its steady-state level (about 1.315 volts) over this time.

Adjust current generator 60 is coupled to receive the adjustment voltage $V_{ADJ}$ being held by sample-adjust-hold circuit 40, and is configured to generate charge rate adjustment current $I_{ADJ}$ (the above-mentioned supplemental current for charging capacitor $C_M$) in response thereto. In preferred embodiments (one of which is described below with reference to FIG. 5), current generator 60 includes current mirror circuitry which generates the supplemental charging current $I_{ADJ}$.

Thus, the FIG. 3 circuit employs feedback (the sampled output voltage $V_{ADJ}$) control the rate at which capacitor $C_M$ is periodically charged, thereby controlling the peak value of ramped output voltage $V_{ADJ}$ so that this peak value tends to match the reference voltage $V_{REF}$. The FIG. 3 circuit operates with timing determined by clock signal CLK and delay circuitry 20 and 30 for generating delayed versions (DCLK and D2CLK) of this clock signal, and includes no comparator within any of elements 10, 11, 20, 30, 40, 60, and the elements coupled to Node A.

Figures 4, 4A:
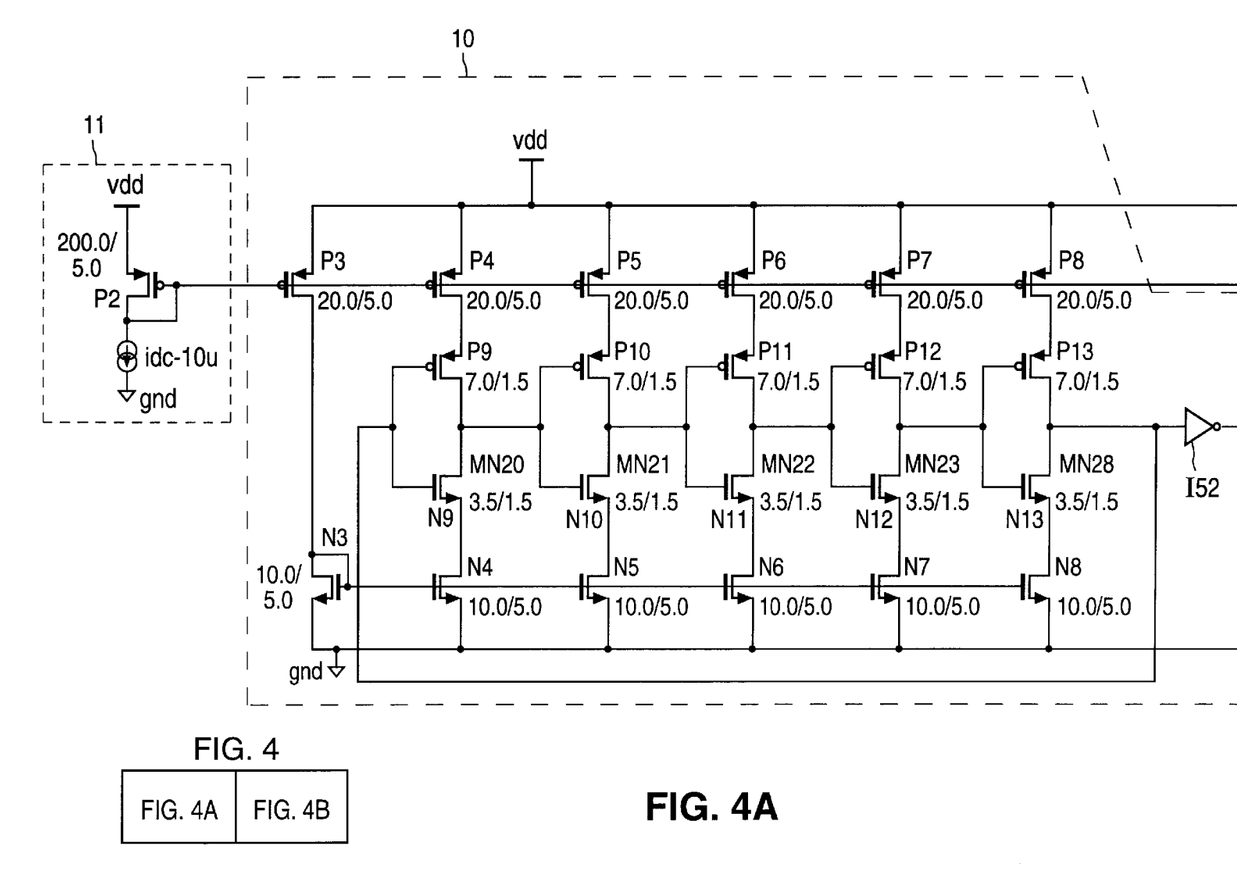
Figure 4B:
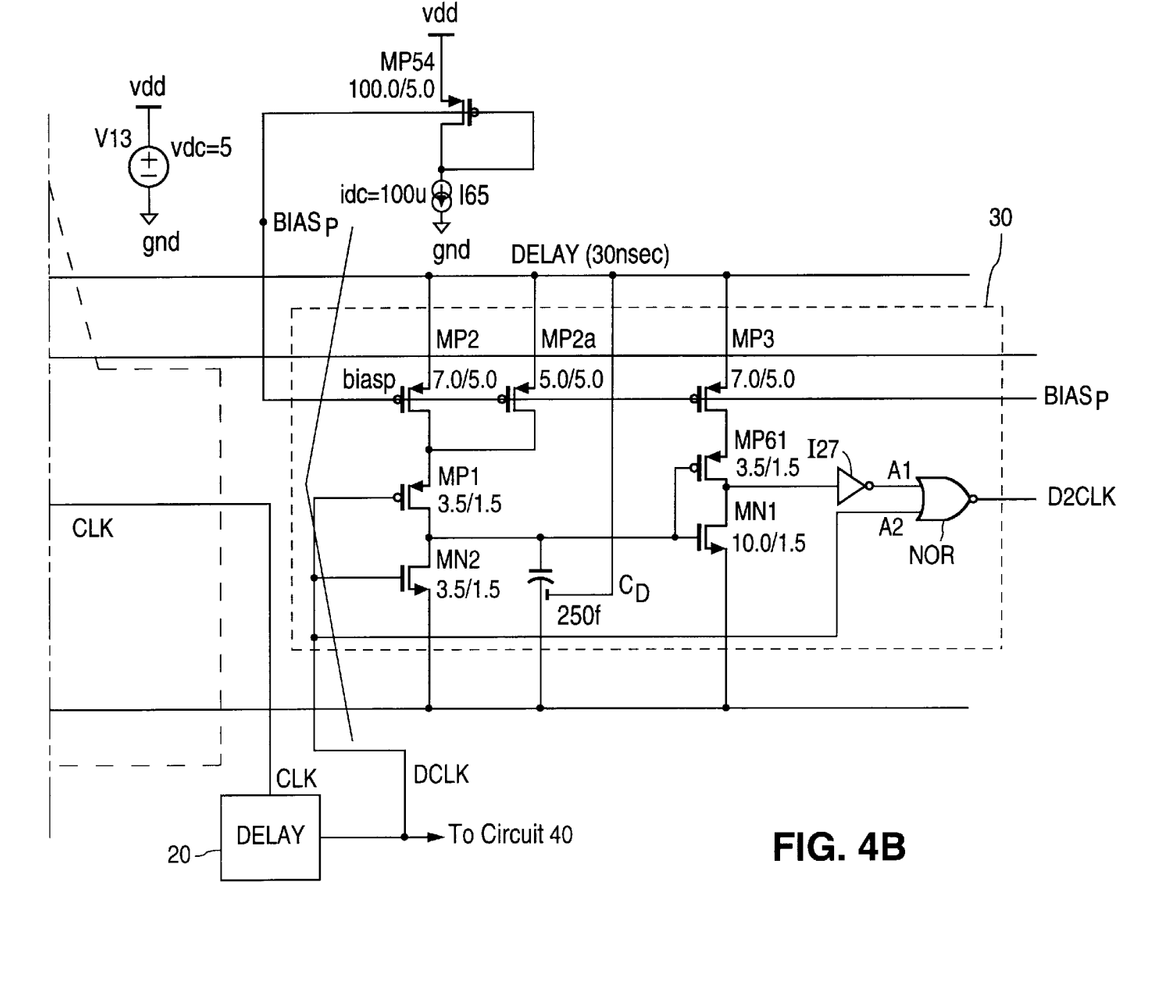
Figure 5A:
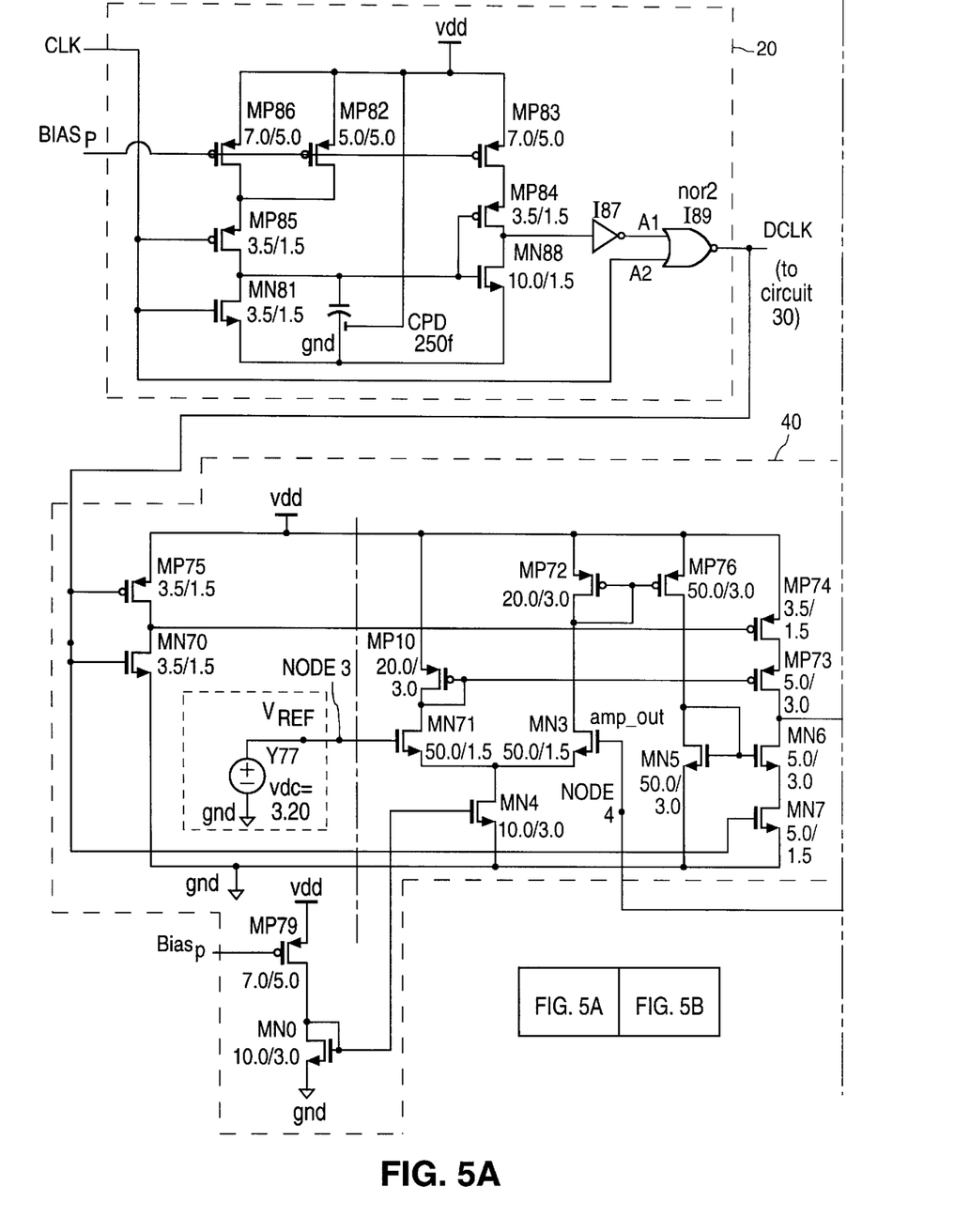
Figure 5B:
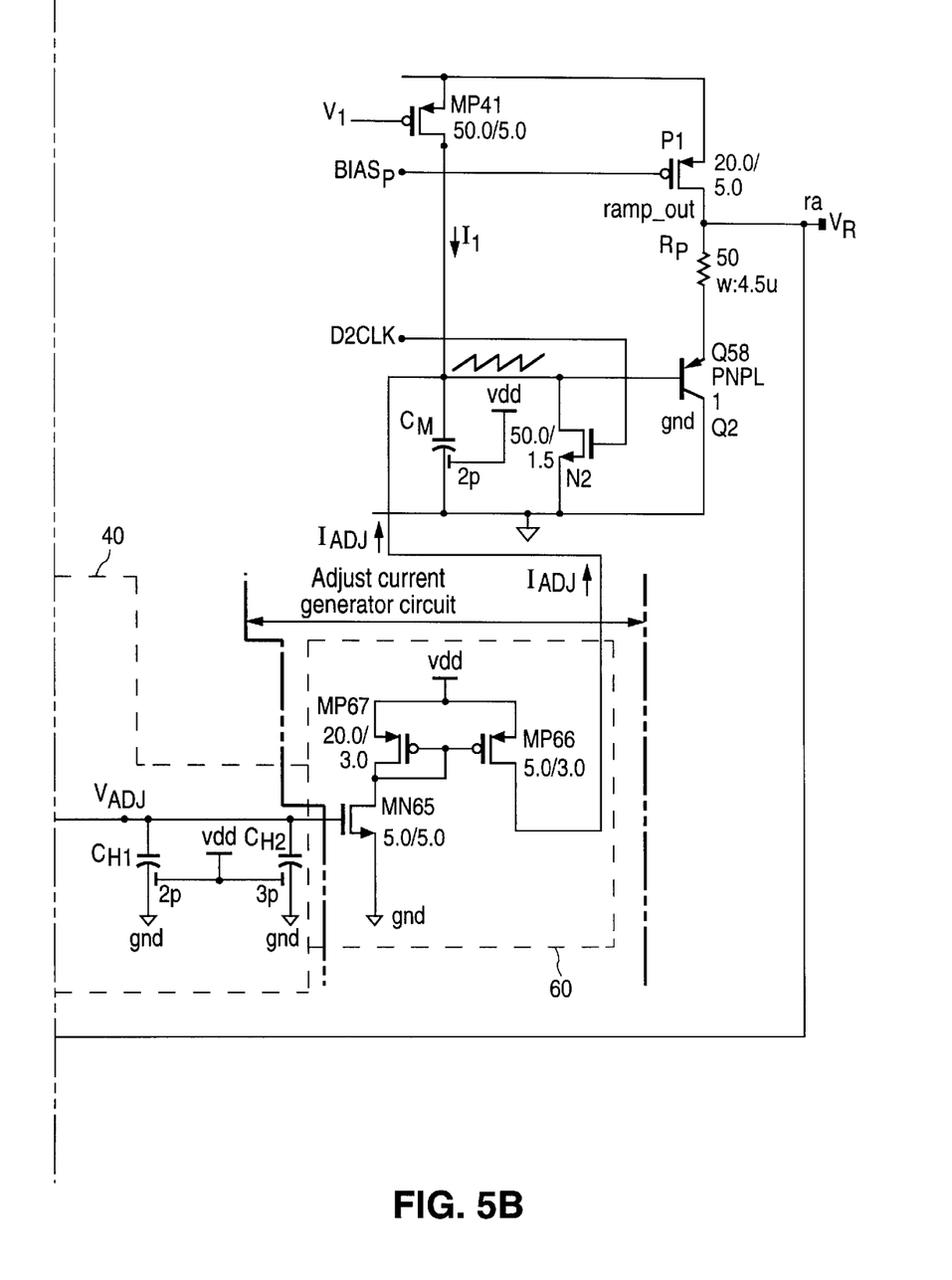

We next describe a preferred implementation of the ramped voltage generation circuit of FIG. 3 with reference to FIGS. 4 and 5.

As shown in FIG. 4, voltage source 11 is preferably implemented with a zero temperature coefficient bias current source connected between ground and the drain of diode-connected PMOS transistor P2. The source of transistor P2 is connected to the top rail (at potential Vdd). The common drain and gate of PMOS transistor P2 are coupled to the input of ring oscillator 10, and remain stably at the bias potential $V_1$. This implementation can generate the bias potential $V_1$ with sufficient temperature stability that the frequency of the CLK signal (generated by circuit 10 in response to the bias potential $V_1$) varies by no more than 1% with temperature over the operating temperature range. Process variations in the frequency of the CLK signal (generated by circuit 10) can be eliminated by trimming of the bias potential.

As also shown in FIG. 4, ring oscillator 10 preferably comprises identical PMOS transistors P3, P4, P5, P6, P7, P8, P9, P10, P11, P12, and P13, identical NMOS transistors N3, N4, N5, N6, N7, N8, N9, N10, N11, N12, and N13, connected as shown, and an inverter 12 whose input is coupled to the common drains of P13 and N13. In each embodiment of the invention, the ring oscillator has N single-ended inverter stages, where N is an odd number greater than one, with the output of the final stage coupled to the input of the first stage. Alternatively, N can be an even number when using differential ring oscillators. There are five stages in the FIG. 4 implementation: a first stage including devices P9 and N9, a second stage including devices P10 and N10, a third stage including devices P11 and N11, a fourth stage including devices P12 and N12, and a fifth stage including devices P13 and N3. The gates of devices P3–P8 are maintained at bias potential $V_1$ and the gates of devices N3–N8 are biased at a potential determined by potential $V_1$, the supply potential $V_{dd}$, and the characteristics of devices P3 and N3, so that each of devices P4–P8 and N4–N8 remains on during operation of the FIG. 3 circuit. Since there are an odd number of inverter stages between the input of the first inverter stage (the common gates of transistors P9 and N9) and the input of inverter 12, the potential at the output of inverter 12 (which is the CLK signal) is a binary pulse train in which the pulses occur with a constant frequency. In the implementation shown, the width of each pulse of the CLK signal is short relative to the period of the CLK signal (e.g., each pulse has duration 30 nsec, where the period of the CLK signal is 100 nsec). Alternatively, the ring oscillator can be implemented so that the clock signal produced thereby is a square wave, or other binary pulse train in which the pulses occur with a constant frequency. It is contemplated that the frequency of signal CLK is in the range from 100 kHz to 10 MHz (where the FIG. 3 circuit is implemented in accordance with the ABCD150 power BiCMOS process with typical process parameters).

Each of delay circuits 20 and 30 is identical, with circuit 20 coupled to receive CLK and generate DCLK in response thereto, and circuit 30 is coupled to receive DCLK and generate D2CLK in response thereto. Thus, only circuit 30 (shown in FIG. 4) will be described in detail.

Circuit 30 is a one-shot circuit which produces a delayed binary voltage pulse train (delayed clock D2CLK) in response to clock signal DCLK (also a binary voltage pulse train) at its input. In the implementation shown in FIG. 4, the rising edge of each pulse (having 30 nsec duration) of input signal DCLK coincides with the falling edge of a pulse of the output signal D2CLK, and each pulse of D2CLK is delayed by 30 nsec relative to the corresponding pulse of DCLK. One-shot circuit 30 of FIG. 4 has a conventional design, in which the output potential D2CLK is the output of a NOR gate, one of the inputs of the NOR gate is the output of inverter 127 (whose input is the common drain of PMOS transistor MP61 and NMOS transistor MN1), and the other of the inputs of the NOR gate is coupled to receive the DCLK signal. Capacitor $C_D$ is coupled between the common gates of transistors MN1 and MP 61 (which is coupled to the common drains of PMOS transistor MP1 and NMOS transistor MN2) and ground. PMOS transistors MP2, MP2a, and MP3 are current source transistors (the current through the channel of each is set by the potential $BIAS_P$). The input signal DCLK is asserted to the gates of MP1 and MN2 as well as to one input of the NOR gate. The rising edge of each pulse of D2CLK coincides with the falling edge of a pulse of DCLK, and the falling edge of each pulse of D2CLK occurs when $C_D$ charges up to a voltage sufficiently high to turn off MP61 and turn on MN1, thus grounding the input of inverter 127.

Next, with reference to FIG. 5, we next describe a preferred implementation of sample-adjust-hold circuit 40, which is designed to respond rapidly to an enabling signal (rising edge of the delayed clock signal DCLK output from circuit 20) received shortly (i.e., 30 nsec) before the start of the discharge cycle of capacitor $C_M$. In response to a rising edge of the signal DCLK, NMOS transistor MN7 and PMOS transistor MP74 rapidly turn on, and diode-connected NMOS transistor MN5 (whose gate and drain are coupled to the gate of NMOS transistor MN6) and diode-connected PMOS transistor MP10 (whose gate and drain are coupled to the gate of PMOS transistor MP73) set the gate potentials of transistors MN6 and MP73 (during the charging cycle of capacitor $C_M$) to levels such that the voltage (the "adjustment" voltage $V_{ADJ}$) of the common drains of MN6 and MP73 (above ground) is indicative of the difference between reference voltage $V_{REF}$ (at Node 3) and a sampled value of the output voltage $V_R$ (at Node 4). After transistors MP74 and MN7 turn off in response to the next falling edge of signal DCLK, capacitors $C_{H1}$, and $C_{H2}$ (coupled between ground and the common drains of MN6 and MP73) hold the adjustment voltage $V_{ADJ}$ for use in the next charging cycle of capacitor $C_M$. Since the gate potentials of MP73 and MN6 are set during the charging portion of the FIG. 3 circuit's operating cycle, they need not be set rapidly and the transconductance amplifier portion of circuit 40 (which generates adjustment voltage $V_{ADJ}$) does not need to be extremely fast. Since transistors MP74 and MN7 rapidly turn on (in response to a rising edge of DCLK) and then turn off (in response to the next falling edge of DCLK), current can flow in transistors MP74 and MN7 for only a brief portion of each cycle of operation of the FIG. 3 circuit.

The FIG. 5 implementation of charge rate adjustment current generator 60 generates supplemental charging current $I_{ADJ}$ for capacitor $C_M$ in response to the adjustment voltage $V_{ADJ}$ being held by capacitors $C_{H1}$, and $C_{H2}$. This implementation of circuit 60 is a current mirror (comprising PMOS transistors MP67 and MP66 and NMOS transistor MN65, connected as shown). Transistors MP67 and MP66 are connected as shown (with their sources at the top rail potential $V_{dd}$, and the gates of MP67 and MP66 and the drain of MP67 connected to the drain of transistor MN65). Thus, the current mirror forces the current $I_{ADJ}$ (through the channel of MP66) to be proportional to the current through the channel of transistor MN65 (which is determined by the voltage $V_{ADJ}$ being held by circuit 40).

The characteristics of the components and reference signals of the circuit of FIGS. 3–5 are indicated (for example, each of capacitor $C_M$ and capacitor $C_{H1}$, has a capacitance of 2 picoFarads, capacitor $C_{H2}$ has a capacitance of 3 picoFarads, capacitor $C_D$ of circuit 30 (of FIG. 5) has a capacitance of 250 femtoFarads, reference potential $V_{REF}$ (at Node 3 of FIG. 5) is 3.28 volts above ground, and each of the transistors shown in FIGS. 3–5 is a MOSFET transistor having channel width to length ratio as indicated, where the indicated widths and lengths are in microns). Those of ordinary skill in the art will appreciate what are appropriate levels for bias potential $V_1$, and $BIAS_p$, and regulated top rail potential $V_{dd}$, in view of the present disclosure. The top rail potential $V_{dd}$ is typically in the range from 1.5 to 10 volts above ground, with $V_{dd}$ being 5 volts above ground in the example shown in FIGS. 4 and 5.

Although only a preferred embodiment has been described in detail herein, those having ordinary skill in the art will certainly understand that many modifications are possible without departing from the teachings hereof. For example, any of the capacitors can be replaced by a set of two or more capacitors connected in parallel, or capacitors $C_{H1}$, and $C_{H2}$ (connected in parallel as shown in FIG. 5) can be replaced by a single capacitor. All such modifications are intended to be encompassed within the following claims.

What is claimed is:

1. A circuit for generating a ramped voltage signal having controlled maximum amplitude without use of a comparator, said circuit including:

output circuitry, including an output capacitor having a first plate at a first node and charging circuitry coupled to the first node, wherein the charging circuitry has an input coupled to receive a clock signal and is configured to charge and discharge the output capacitor periodically in response to the clock signal to produce the ramped voltage signal across said output capacitor;

supplemental charge current circuitry having a first input coupled to receive a reference signal whose level is indicative of a preselected maximum amplitude for the ramped voltage signal, a second input which receives a feedback signal indicative of the ramped voltage signal, and an output coupled to the first node, wherein the supplemental charge current circuitry is configured to cause a charge rate adjustment current to flow from the output to the first node, the charge rate adjustment current having a magnitude indicative of the difference between the level of the reference signal and a sampled level of the feedback signal, whereby the charge rate adjustment current corrects the amplitude of the ramped voltage signal during charging of the output capacitor to cause the maximum amplitude of the ramped voltage signal to converge to the preselected maximum amplitude; and comparator-less clock signal generation circuitry coupled to the output circuitry and configured to generate the clock signal and assert said clock signal to the output circuitry.

2. The circuit of claim 1, wherein the output circuitry also includes:

a level shifting circuit coupled between the first node and a second node and configured to generate, at the second node, a level shifted voltage signal having amplitude proportional to that of the ramped voltage signal, and wherein the feedback signal is the level shifted voltage signal and the second node of the output circuitry is coupled to the second input of the supplemental charge current circuitry.

3. The circuit of claim 1, wherein the comparator-less clock signal generation circuitry includes a ring oscillator.

4. The circuit of claim 3, wherein the ring oscillator is a current-starved ring oscillator, and the comparator-less clock signal generation circuitry also includes a zero temperature coefficient bias current source which produces a bias potential for biasing the current-starved ring oscillator.

5. The circuit of claim 1, wherein the comparator-less clock signal generation circuitry includes:

first circuitry configured to generate a second clock signal having frequency identical to that of the clock signal; and delay circuitry configured to generate the clock signal by delaying the second clock signal, wherein the supplemental charge current circuitry has a third input coupled to receive the second clock signal, and the supplemental charge current circuitry is configured to produce the charge rate adjustment current in response to the second clock signal, the feedback signal, and the reference signal.

6. The circuit of claim 5, wherein the output circuitry begins to charge the output capacitor at a charge time of each cycle of the second clock signal and begins to discharge the output capacitor at a discharge time of said each cycle of the second clock signal, wherein the charge time of said each cycle precedes the discharge time of said each cycle of the second clock signal, and wherein the supplemental charge current circuitry includes:

sample and hold circuitry configured to generate an adjustment voltage indicative of the difference between instantaneous levels of the reference signal and the feedback signal, and to hold the adjustment voltage at a sampling time of said each cycle of the second clock signal, wherein the sampling time of said each cycle follows the discharge time of said each cycle of the second clock signal; and current mirror circuitry, coupled to the sample and hold circuitry, and configured to generate the charge rate adjustment current in response to the adjustment voltage being held by the sample and hold circuitry.

7. The circuit of claim 5, wherein the first circuitry includes a ring oscillator.

8. The circuit of claim 1, wherein said circuit is an integrated circuit, and the integrated circuit is configured to generate the ramped voltage signal to have maximum amplitude which is at least substantially independent of temperature variation during operation of said integrated circuit.

9. The circuit of claim 1, wherein said circuit is a portion of an integrated circuit, and the integrated circuit is configured to generate the ramped voltage signal to have maximum amplitude which is at least substantially independent of temperature variation during operation of said integrated circuit.

10. The circuit of claim 1, wherein the supplemental charge current circuitry includes:

sample-adjust-hold circuitry configured to sample the feedback signal shortly before the output capacitor discharges and generates an adjustment voltage indicative of the difference between the level of the reference signal and the sampled level of the feedback signal, and to hold the adjustment voltage for use in the next charging cycle of the output capacitor.

11. The circuit of claim 10, wherein the supplemental charge current circuitry also includes:

current mirror circuitry coupled to the sample-adjust-hold circuitry and configured to generate the charge rate adjustment current in response to the adjustment voltage held by the sample-adjust-hold circuitry.

12. The circuit of claim 10, wherein the sample-adjust-hold circuitry includes a holding capacitor across which the adjustment voltage is held, and wherein the supplemental charge current circuitry also includes:

a first MOSFET device coupled to the holding capacitor such that the adjustment voltage across the holding capacitor controls a gate potential of the first MOSFET device, thereby determining a first current through the first MOSFET device; and a current mirror coupled to the first MOSFET device such that the first MOSFET device draws the first current from the current mirror to cause said current mirror to generate the adjustment current.

13. A switching controller for generating at least one pulse width-modulated power switch control signal for a DC-to-DC converter, wherein said controller includes a ramped voltage generation circuit for generating a ramped voltage signal having controlled maximum amplitude without use of a comparator, and wherein said controller generates said at least one pulse width modulated power switch control signal in response to the ramped voltage signal, said ramped voltage generation circuit including:

output circuitry, including an output capacitor having a first plate at a first node and charging circuitry coupled to the first node, wherein the charging circuitry has an input coupled to receive a clock signal and is configured to charge and discharge the output capacitor periodically in response to the clock signal to produce the ramped voltage signal across said output capacitor;

supplemental charge current circuitry having a first input coupled to receive a reference signal whose level is indicative of a preselected maximum amplitude for the ramped voltage signal, a second input which receives a feedback signal indicative of the ramped voltage signal, and an output coupled to the first node, wherein the supplemental charge current circuitry is configured to cause a charge rate adjustment current to flow from the output to the first node, the charge rate adjustment current having a magnitude indicative of the difference between the level of the reference signal and a sampled level of the feedback signal, whereby the charge rate adjustment current corrects the amplitude of the ramped voltage signal during charging of the output capacitor to cause the maximum amplitude of the ramped voltage signal to converge to the preselected maximum amplitude; and comparator-less clock signal generation circuitry coupled to the output circuitry and configured to generate the clock signal and assert said clock signal to the output circuitry.

14. The controller of claim 13, wherein the output circuitry also includes:

a level shifting circuit coupled between the first node and a second node and configured to generate, at the second node, a level shifted voltage signal having amplitude proportional to that of the ramped voltage signal, and wherein the feedback signal is the level shifted voltage signal and the second node of the output circuitry is coupled to the second input of the supplemental charge current circuitry.

15. The controller of claim 13 wherein the comparator-less clock signal generation circuitry includes a ring oscillator.

16. The controller of claim 15, wherein the ring oscillator is a current-starved ring oscillator, and the comparator-less clock signal generation circuitry also includes a zero temperature coefficient bias current source which produces a bias potential for biasing the current-starved ring oscillator.

17. The controller of claim 13, wherein the comparator-less clock signal generation circuitry includes:

first circuitry configured to generate a second clock signal having frequency identical to that of the clock signal; and delay circuitry configured to generate the clock signal by delaying the second clock signal, wherein the supplemental charge current circuitry has a third input coupled to receive the second clock signal, and the supplemental charge current circuitry is configured to produce the charge rate adjustment current in response to the second clock signal, the feedback signal, and the reference signal.

18. The controller of claim 17, wherein the output circuitry begins to charge the output capacitor at a charge time of each cycle of the second clock signal and begins to discharge the output capacitor at a discharge time of said each cycle of the second clock signal, wherein the charge time of said each cycle precedes the discharge time of said each cycle of the second clock signal, and wherein the supplemental charge current circuitry includes:

sample and hold circuitry configured to generate an adjustment voltage indicative of the difference between instantaneous levels of the reference signal and the feedback signal, and to hold the adjustment voltage at a sampling time of said each cycle of the second clock signal, wherein the sampling time of said each cycle follows the discharge time of said each cycle of the second clock signal; and current mirror circuitry, coupled to the sample and hold circuitry, and configured to generate the charge rate adjustment current in response to the adjustment voltage being held by the sample and hold circuitry.

19. The controller of claim 17, wherein the first circuitry includes a ring oscillator.

20. The controller of claim 13, wherein the supplemental charge current circuitry includes:

sample-adjust-hold circuitry configured to sample the feedback signal shortly before the output capacitor discharges and generates an adjustment voltage indicative of the difference between the level of the reference signal and the sampled level of the feedback signal, and to hold the adjustment voltage for use in the next charging cycle of the output capacitor.

* * * * *